(12) United States Patent
Ou

(10) Patent No.: US 7,986,984 B2
(45) Date of Patent: Jul. 26, 2011

(54) ELECTRONIC DEVICE WITH PROTECTION COVER

(75) Inventor: Chung-Yuan Ou, Taoyuan (TW)

(73) Assignee: HTC Corporation, Taoyuan, Taoyuan County (TW)

( * ) Notice: Subject to any disclaimer, the term of this patent is extended or adjusted under 35 U.S.C. 154(b) by 692 days.

(21) Appl. No.: 12/118,796

(22) Filed: May 12, 2008

(65) Prior Publication Data

US 2008/0297991 A1 Dec. 4, 2008

(30) Foreign Application Priority Data

May 31, 2007 (TW) ................................ 96119615 A

(51) Int. Cl.
*H04M 1/00* (2006.01)

(52) U.S. Cl. .............. 455/575.4; 455/575.8; 361/679.01

(58) Field of Classification Search ............... 455/550.1, 455/575.1, 575.3, 575.4, 574.8, 90.1, 347, 455/351; 379/433.1, 433.11, 433.12; 361/752, 361/679.01, 679.02, 679.05
See application file for complete search history.

(56) References Cited

U.S. PATENT DOCUMENTS

| 5,796,576 A | * | 8/1998 | Kim ......................... 361/679.28 |
| 2005/0078817 A1 | * | 4/2005 | Lee ........................... 379/433.12 |
| 2010/0124001 A1 | * | 5/2010 | Zhou et al. ............... 361/679.01 |
| 2010/0259872 A1 | * | 10/2010 | Yang et al. ............... 361/679.01 |

* cited by examiner

*Primary Examiner* — Thanh C Le
(74) *Attorney, Agent, or Firm* — Thomas|Kayden

(57) ABSTRACT

An electronic device including a main body, a cap body, a flexible printed circuit board and a protection cover is provided. The cap body disposed on the main body is capable of moving between a first position and a second position on the main body and rotating with respect to the main body in the second position. The flexible printed circuit board connects to the main body and the cap body. The protection cover is slidably disposed on the cap body and has a receiving space. When the cap body rotates in the second position, part of the flexible printed circuit board is within the receiving space and protected by the protection cover.

16 Claims, 9 Drawing Sheets

ELECTRONIC DEVICE WITH PROTECTION COVER

This application claims the benefit of Taiwan application Serial No. 96119615, filed May 31, 2007, the subject matter of which is incorporated herein by reference.

BACKGROUND OF THE INVENTION

1. Field of the Invention

The invention relates in general to an electronic device, and more particularly to an electronic device whose cap body is capable of moving and rotating.

2. Description of the Related Art

At present, electronic devices, especially handheld ones, such as smart phones or personal digital assistants (PDA), are designed as single-body structures (for example bar type structure), double-body structure (for example sliding type structure), or multi-body structure. Electronic devices that employ a single-body structure have a monitor and a keyboard integrated into the same body. Devices having double-body or multi-body structure are also popular nowadays and have a monitor and a keyboard positioned in different bodies that are usually connected by a sliding hinge or a rotating hinge.

Take the electronic device having double-body structure for example. The double-body structure of the electronic device is composed of a cap body and a main body. The signal transmission between the cap body and the main body is through a flexible printed circuit board that is used for connecting the main body with the cap body. The cap body and the main body are usually combined by a rotating hinge so that the cap body can rotate to an open position with respect to the main body. The cap body and the main body are also combined by a sliding hinge so that the cap body can slide on the main body. No matter what kind of hinge is used, there is an overlap between the main body and the cap body, so that the flexible printed circuit board can be hidden in the overlap.

However, as the electronic device has both a rotating hinge and a sliding hinge, the cap body only can rotates to a open position in a particular position on the main body when the cap body slides to the particular position. When the cap body and main body are in the open position, part of the flexible printed circuit board is exposed though the opening between the cap body and the main body. The exposed flexible printed circuit board is more likely to be damaged due to environmental factors such as artificial factor or humidity, which deteriorates the quality of the flexible printed circuit board.

SUMMARY OF THE INVENTION

It is therefore an object of the invention to provide an electronic device with a protection cover. While operating the electronic device, the protection cover covers the flexible printed circuit board and isolates the flexible printed circuit board from the exterior, so that the flexible printed circuit board does not easily get damaged.

The invention achieves the above-identified object by providing an electronic device, which has a main body, a cap body, a flexible printed circuit board, and a protection cover. The cap body, which is disposed on the main body, is capable of moving between a first position and a second position on the main body and rotating with respect to the main body in the second position. The flexible printed circuit board connects to the main body and the cap body. The protection cover is slidably disposed on the cap body and has a receiving space. When the cap body rotates in the second position, part of the flexible printed circuit board is within the receiving space and protected by the protection cover.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
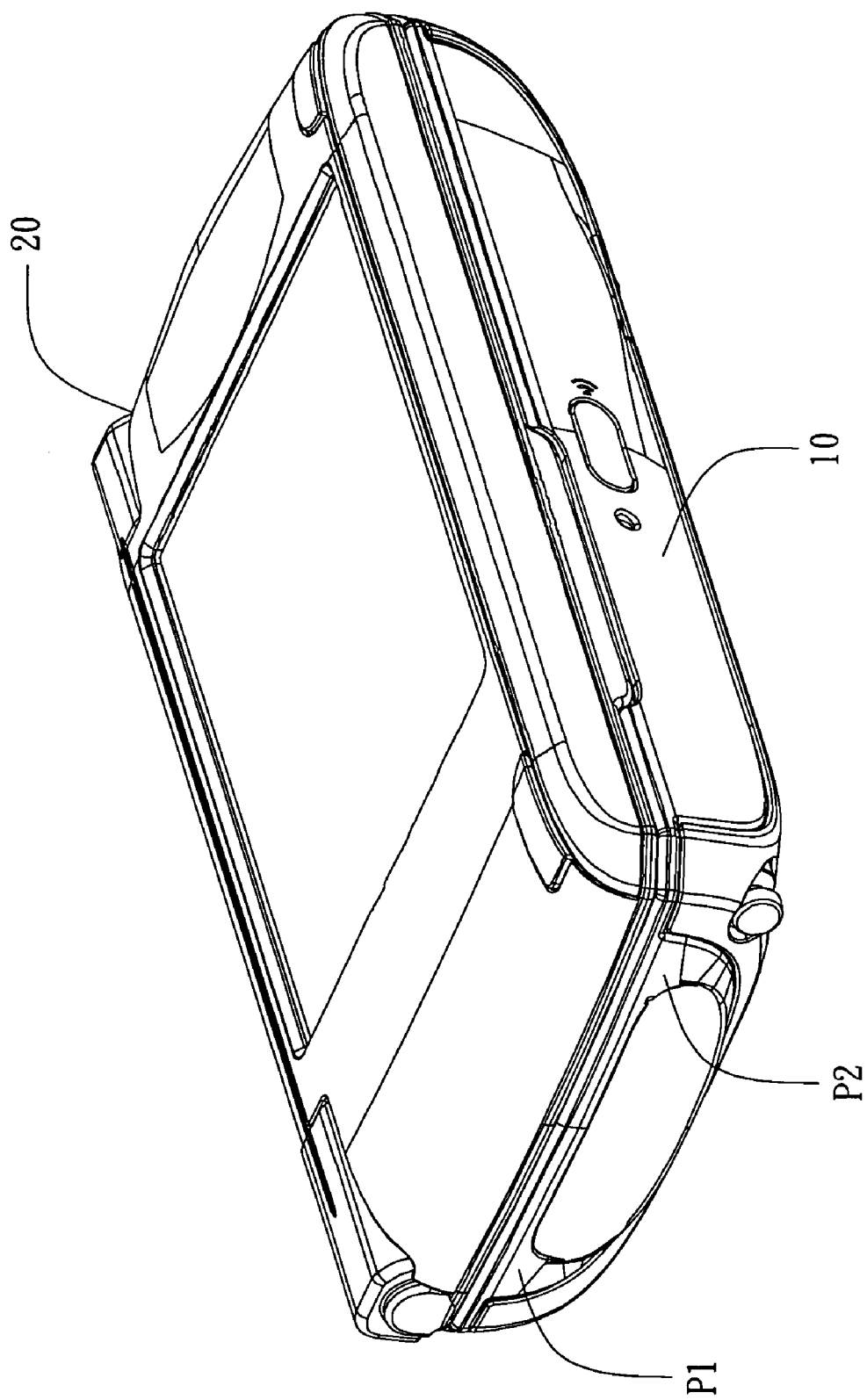
FIGS. 1A to 1C are diagrams showing an electronic device in continuous motion according to a preferred embodiment of the invention.
Figure 1B:
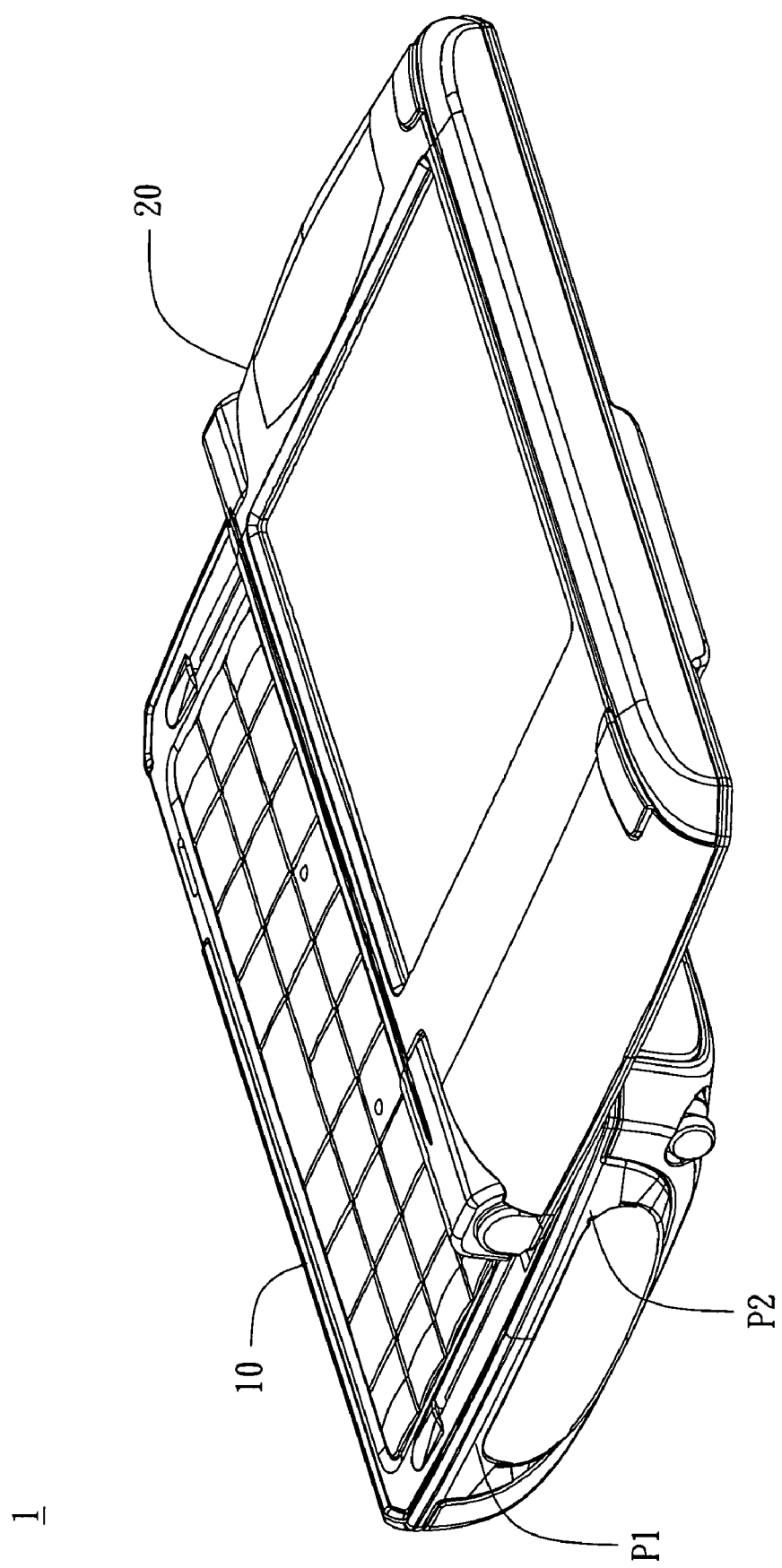
Figure 1C:
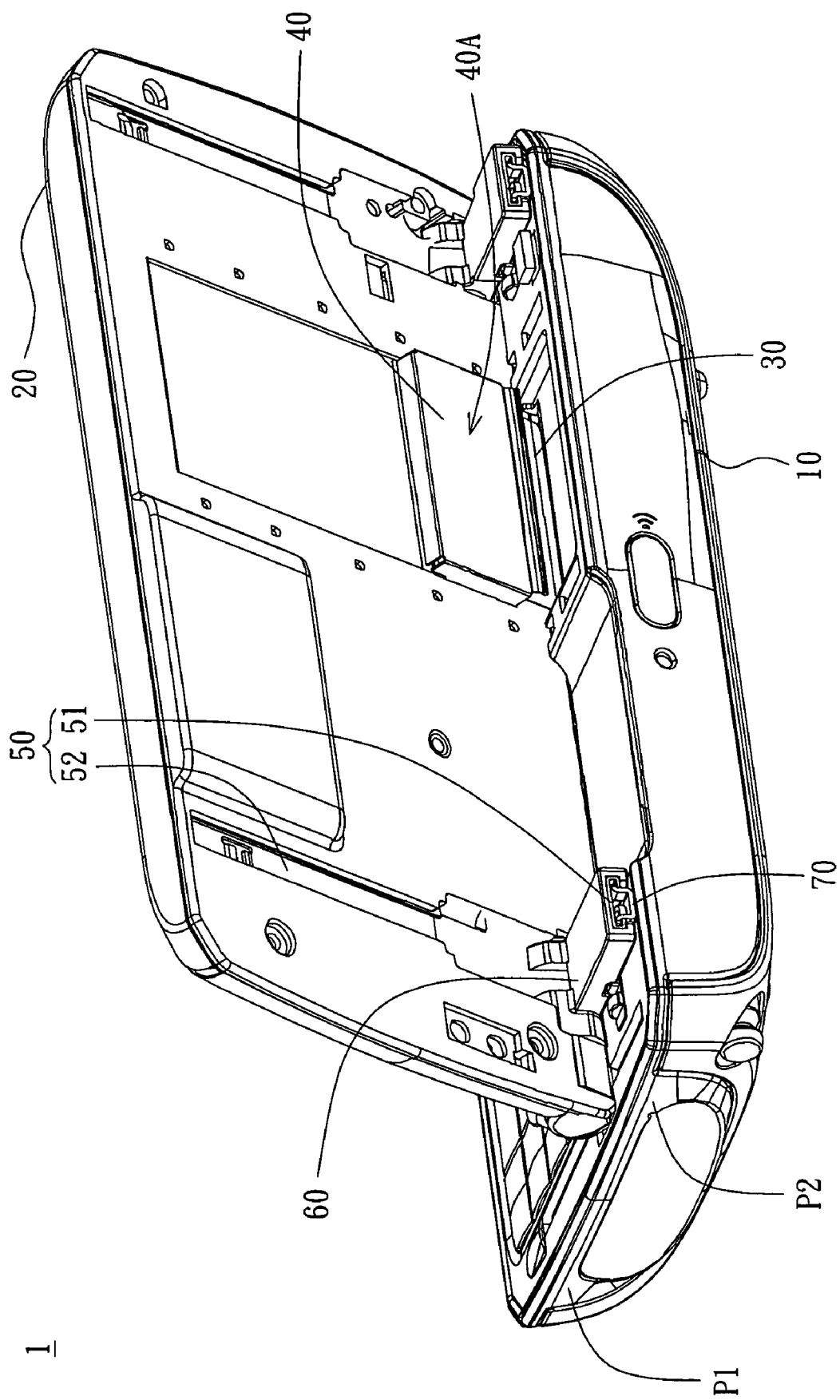

FIGS. 1A to 1C show an electronic device in continuous motion according to a preferred embodiment of the invention. Electronic device 1 includes a main body 10, a cap body 20, a flexible printed circuit board 30, and a protection cover 40. The cap body 20, which is disposed on the main body 10, is capable of moving between a first position P1 (as shown in FIG. 1A) and a second position P2 (as shown in FIG. 1B) on the main body 10 and rotating with respect to the main body 10 in the second position P2 (as shown in FIG. 1C). The flexible printed circuit board 30 (shown in FIGS. 3A-3C) connects to the main body 10 and the cap body 20. The protection cover 40 is slidably disposed on the cap body 20 and has a receiving space 40A (shown in FIG. 2A). When the cap body 20 rotates in the second position P2, part of the flexible printed circuit board 30 is within the receiving space 40A and protected by the protection cover 40.

As shown in FIG. 1C, the electronic device 1 further includes a two-section track structure 50, a hinge 60, and a sliding element 70. The two-section track structure 50 is disposed on an undersurface of the cap body 20 and has a first track 51 and a second track 52, wherein the first track 51 is fixed on the cap body 20. As the cap body 20 is covered on the main body 10, one end of the second track 52 is opposite to one end of the first track 51, so that the first track 51 and the second track 52 form a straight track structure and a gap exists between the first track 51 and the second track 52. The hinge 60 is disposed on the cap body 20 and connects to the second track 52, and the second track 52 can rotate with respect to the cap body 20 via the hinge 60. The sliding element 70 is fixed on the main body 10 and coupled to the two-section track structure 50. By use of the two-section track structure 50, the hinge 60, and the sliding element 70, the cap body 20 is capable of sliding on the main body 10 and rotating in the position P2.

When the cap body 20 moves between the first position P1 and the second position P2, the sliding element 70 slides on the first track 51 or the second track 52. While the cap body 20 is in the second position P2, the sliding element 70 is coupled to the second track 52 and fixes the second track 52 on the main body 10 since the sliding element 70 is fixed on the main body 10. Therefore, the cap body 20 and the first track 51 are capable of rotating with respect to the main body 10 and the second track 52 via the hinge 60.

Figure 2A:
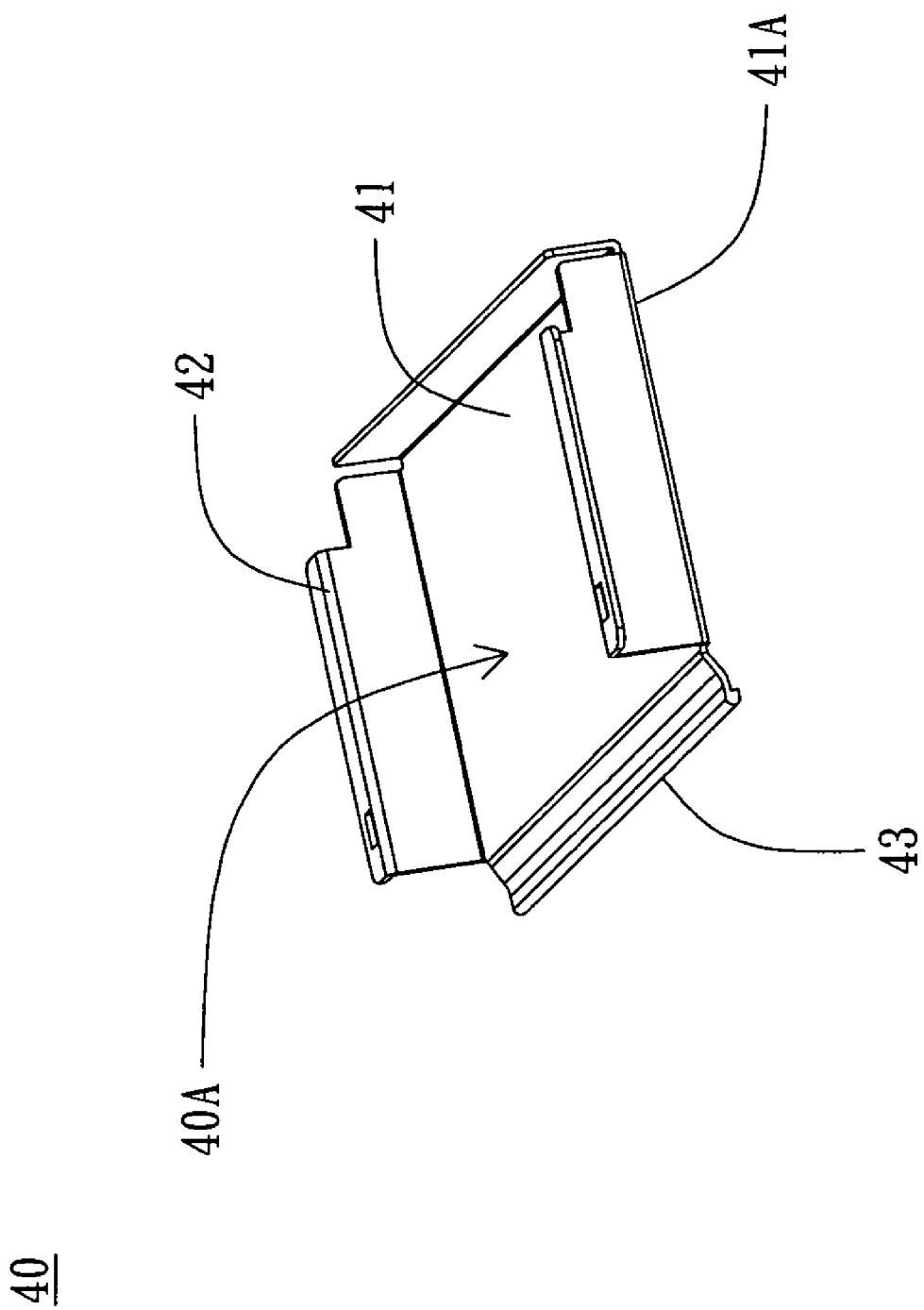
FIG. 2A is a diagram showing the protection cover according to a preferred embodiment of the invention.

FIG. 2A is a diagram showing the protection cover according to a preferred embodiment of the invention. The protection cover 40 has a bottom plate 41 and two side plates 42. The two side plates 42 connect to two edges of the bottom plate 41 to form the receiving space 40A. Preferably, the bottom plate 41 has a shovel-shaped front edge 43, which is substantially perpendicular to the two edges of the bottom plate 41. When moving the cap body 20 with respect to the main body 10 of the electronic device 1, part of the flexible printed circuit board 30 moves into the receiving space 40A of the protection cover 40. The shovel-shaped front edge 43 can prevent the protection cover 40 from scraping the flexible printed circuit board 30.

Figure 2B:
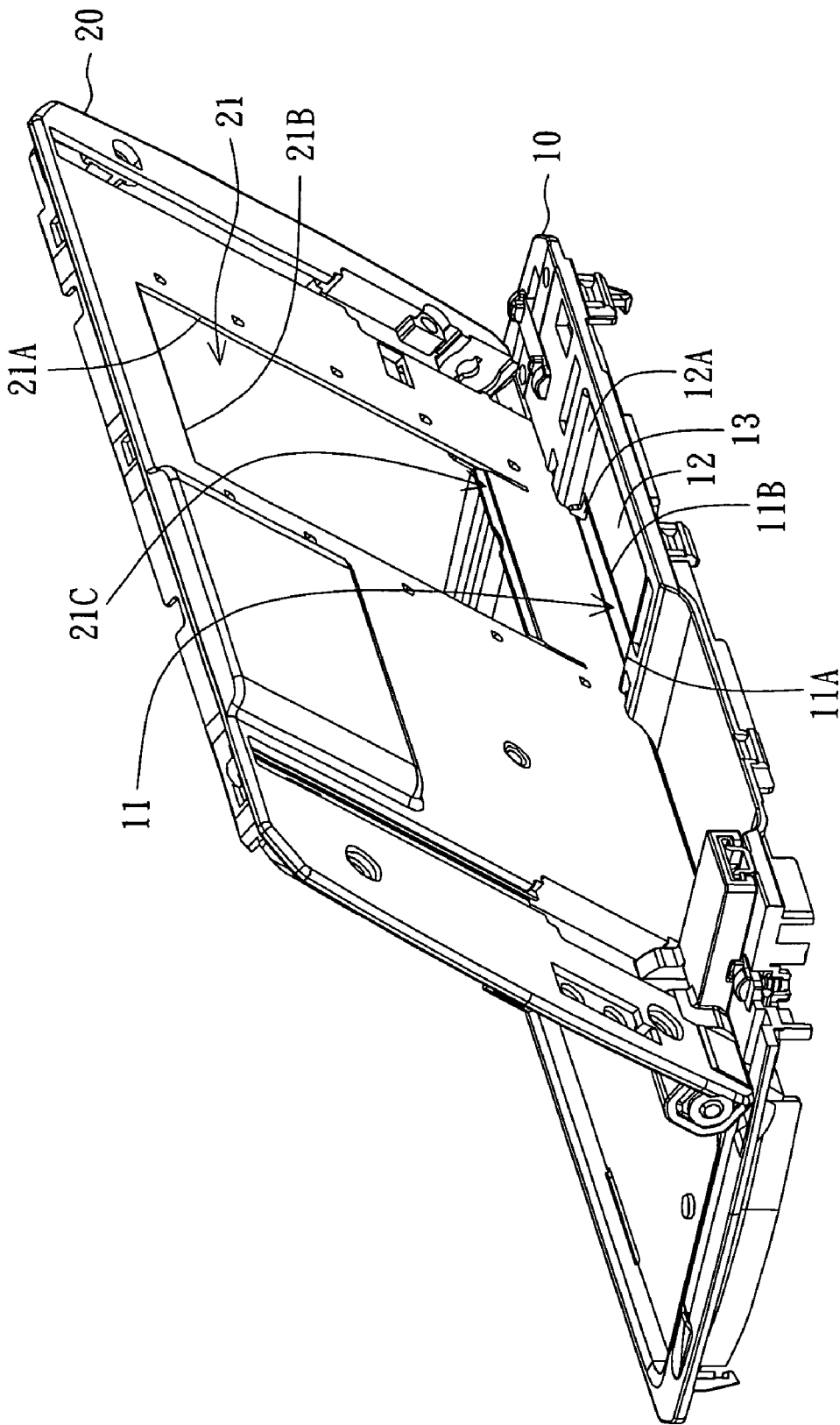
FIGS. 2B and 2C are diagrams showing a part of the electronic device in FIG. 1C.
Figure 2C:
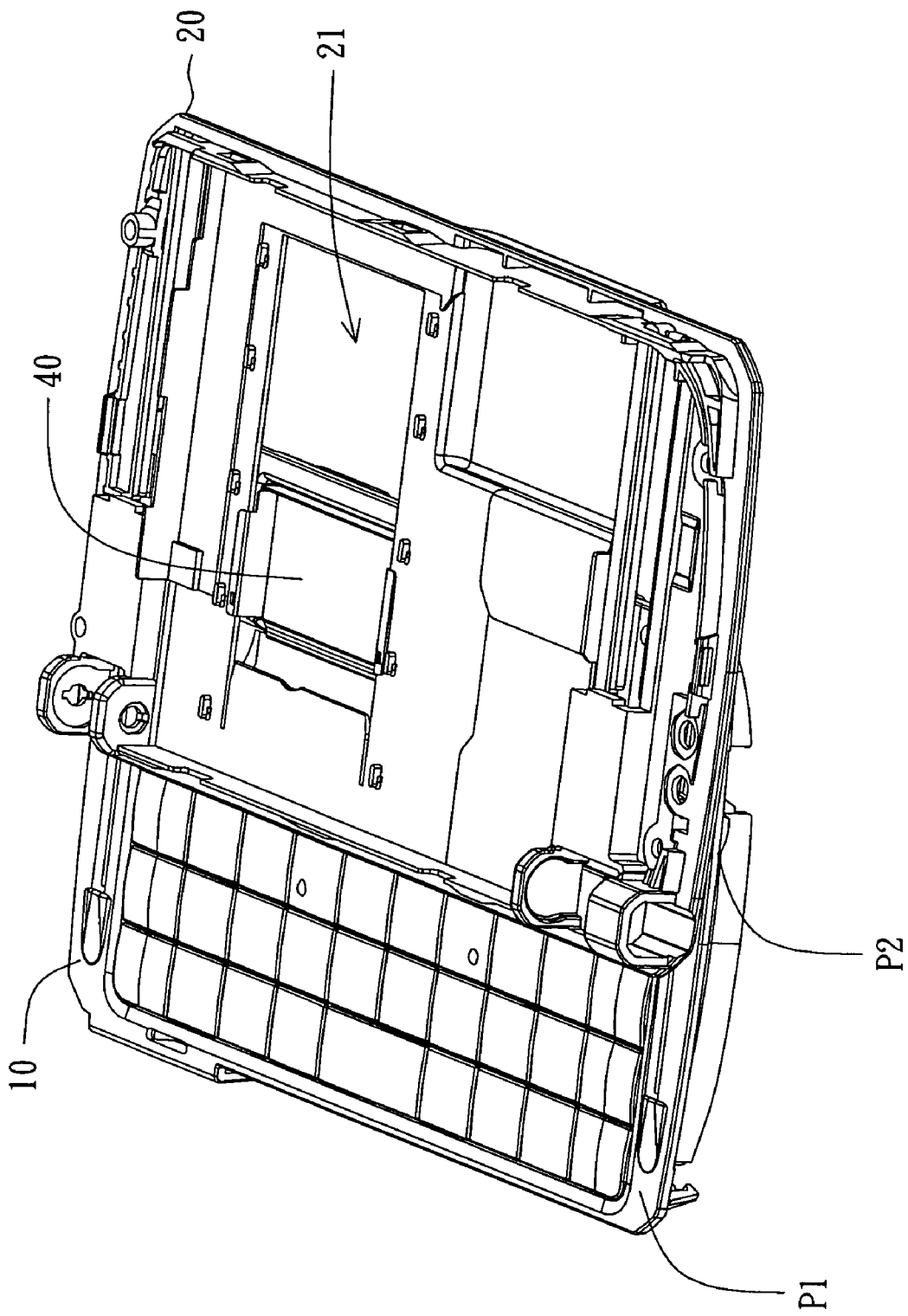

FIGS. 2B and 2C are diagrams showing a part of the electronic device 1 in FIG. 1C. The main body 10 has a first opening 11, which is positioned on the upper surface of the main body 10. The cap body 20 has a second opening 21 positioned on the undersurface of the cap body 20. The first opening 11 and the second opening 21 allow the flexible printed circuit board 30 to connect to the main body 10 and the cap body 20. The protection cover 40 is coupled to the cap body 20 via the second opening 21.

The first opening 11 has two opposite first opening side edges 11A and one first opening front edge 11B disposed on the main body 10. The two first opening side edges 11A connect with the first opening front edge 11B to form the first opening 11, which is substantially rectangular. On the cap body 20, the second opening 21 has two opposite second opening side edges 21A, a second opening front edge 21B, and a second opening rear edge 21C. The two second opening side edges 21A connect to the second opening front edge 21B and the second opening rear edge 21C to form the second opening 21, which is substantially rectangular. The two side plates 42 of the protection cover 40 are coupled to the two second opening side edges 21A, and are capable of moving between the second opening front edge 21B and the second opening rear edge 21C.

The main body 10 also has a concave portion 12 and two blocks 13. The concave portion 12 is adjacent to the first opening 11 for receiving a part of the protection cover 40 and fixing the protection cover 40 on the main body 10 when the cap body 10 moves between the first position P1 and the second position P2. The concave portion 12 has two opposite inner walls 12A, which are adjacent to the two first opening side edges 11A. The two blocks 13 are disposed on the two first opening side edges 11A and near the first opening front edge 11B. The two blocks 13 can fix the protection cover 40 onto the main body 10 by blocking the protection cover 40.

Figure 3A:
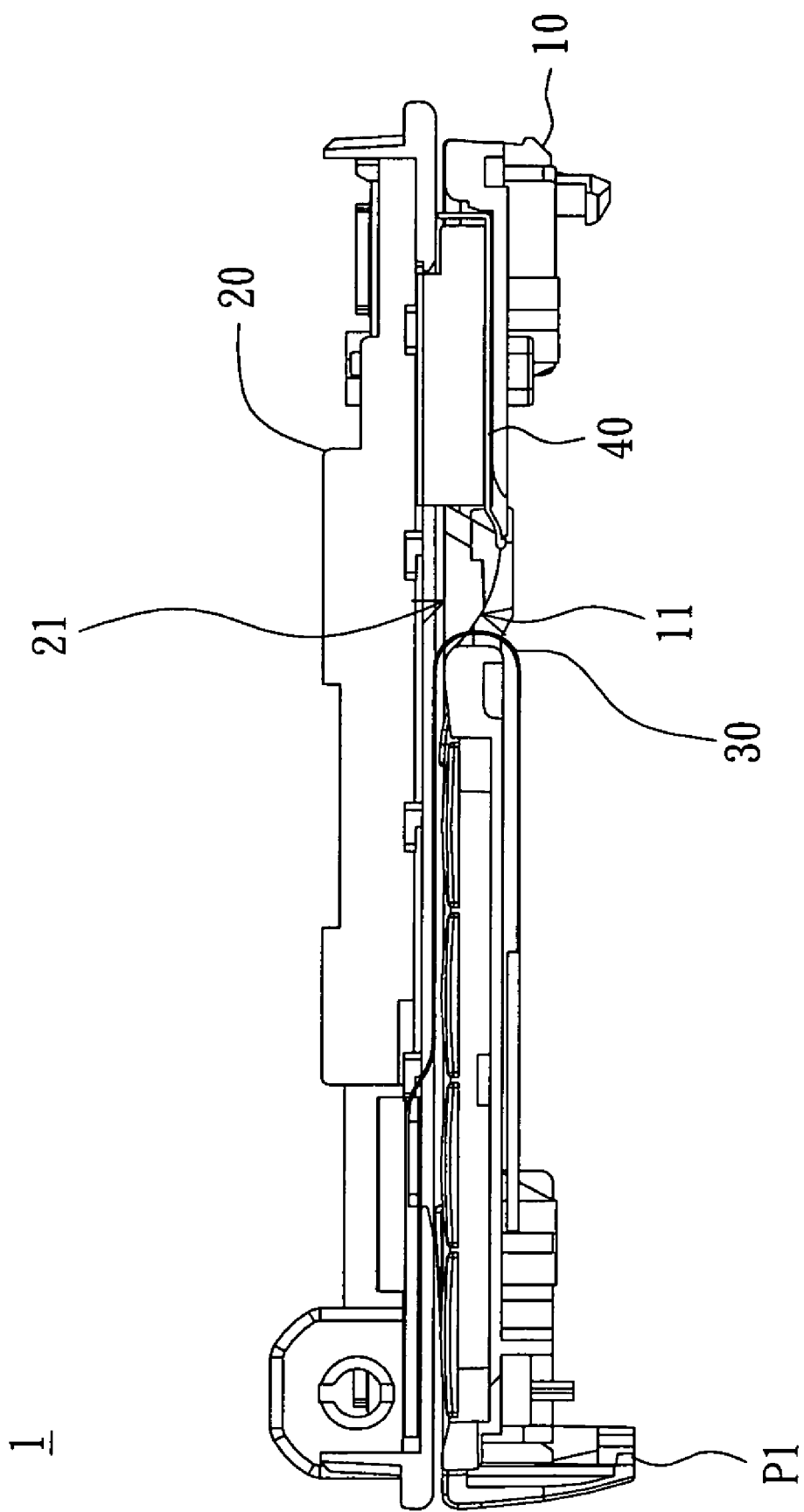
FIGS. 3A to 3C are cross-sectional views of the electronic device of FIG. 1A in continuous motion.
Figure 3B:
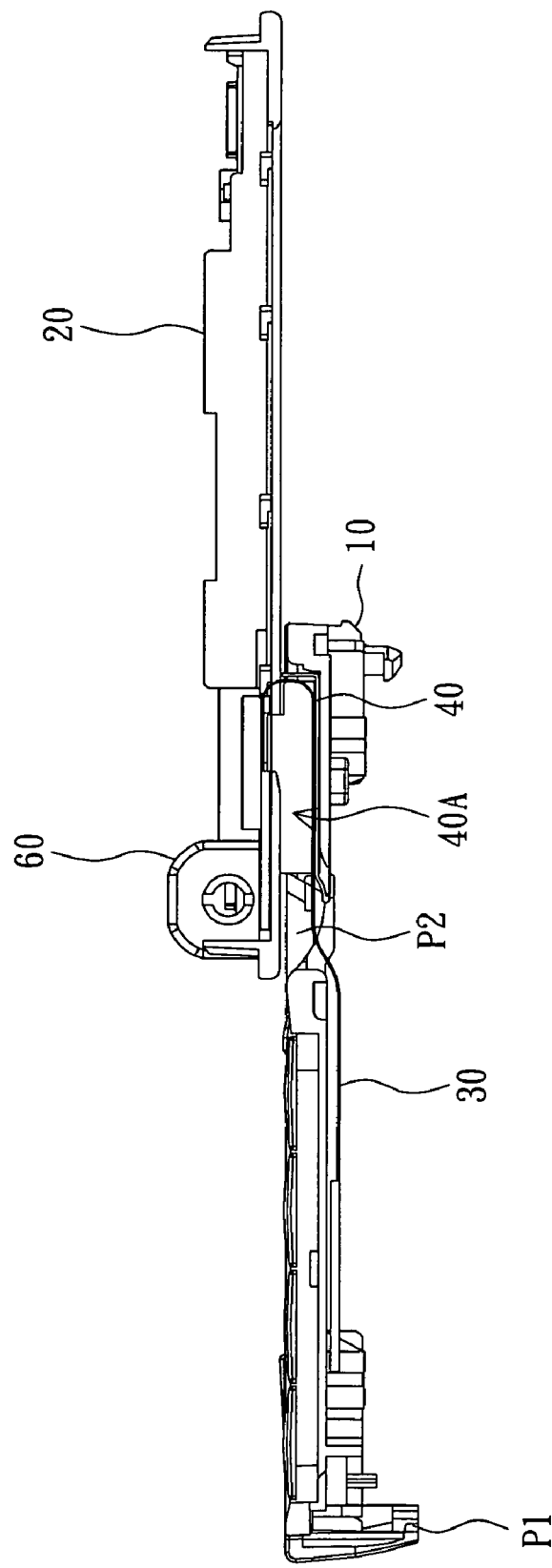
Figure 3C:
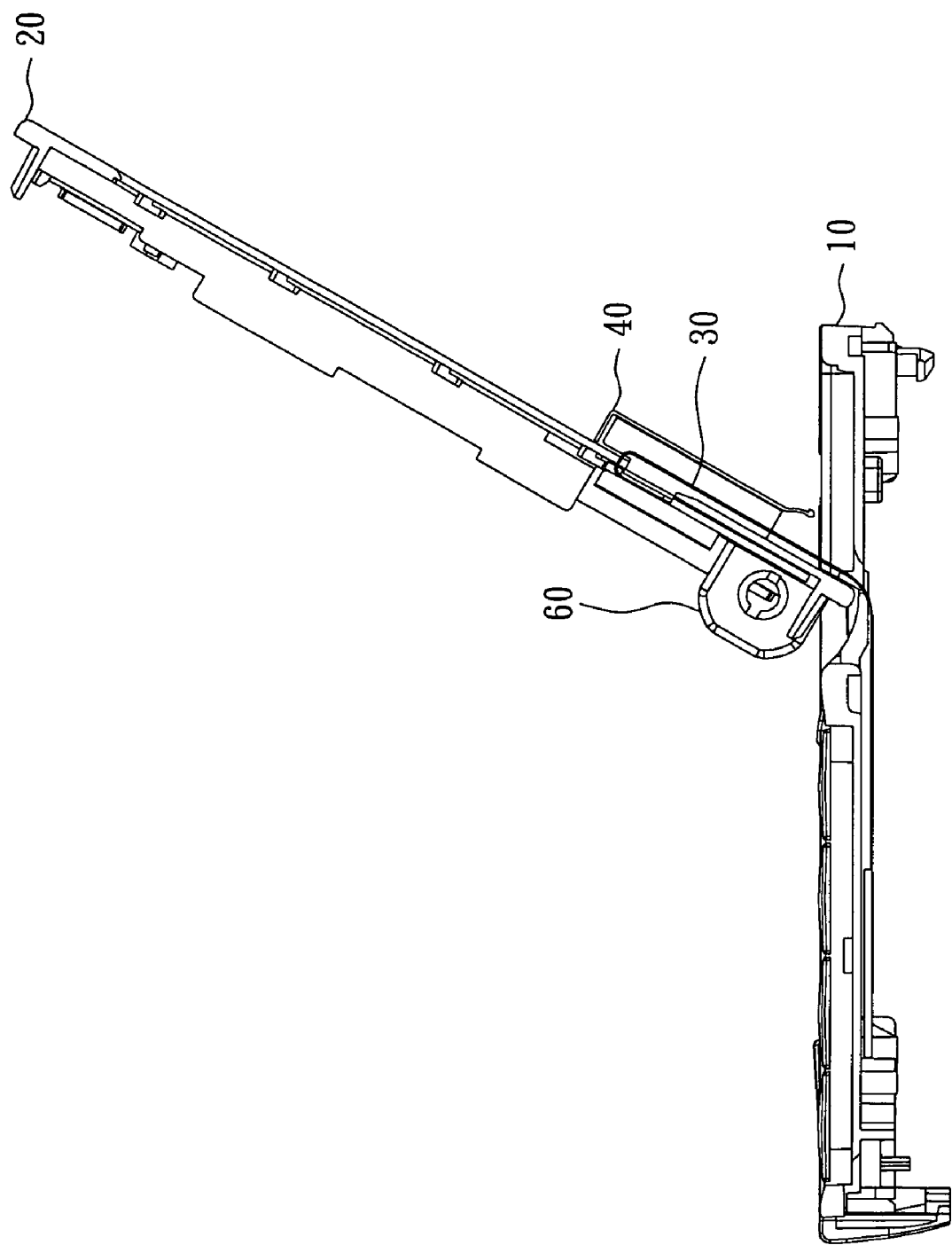

FIGS. 3A to 3C are cross-sectional views of the electronic device of FIG. 1A in continuous motion. As shown in FIG. 3A, when the cap body 20 and the main body 10 completely overlap, the cap body 20 is located in the first position P1 on the main body 10, and the flexible printed circuit board 30, which passes through the first opening 11 and the second opening 21, connects to the main body 10 and the cap body 20. As shown in FIG. 3B, when the cap body 20 slides from the position P1 to the second position P2 on the main body 10, part of the flexible printed circuit board 30 gradually moves into the receiving space 40A of the protection cover 40. The sliding element 70 (shown in FIG. 1C) fixed on the main body 10 will then be coupled to the second track 52, which will connect to the hinge 60 of the cap body 20. Therefore, when the cap body 20 is located in the second position P2, the second track 52 is also fixed on the main body 10 by the sliding element 70, so that the cap body 20 can rotate with respect to the main body 10 via the hinge 60. Since the protection cover 40 is coupled to the cap body 20, as shown in FIG. 3C, the protection cover 40 rotates along with the cap body 20 and covers the flexible printed circuit board 30.

In the present embodiment of the invention, the electronic device 1 preferably has a keyboard mounted on the upper-surface of the main body 10 for providing the user with an input function. In addition, a display device can be mounted on the upper-surface of the cap body 20 for displaying information.

The electronic device 1 can be a portable or handheld device that has a double-body or multi-body structure and has both a sliding hinge and a rotating hinge. However, it can also be a portable or handheld device that has only a sliding hinge or a rotating hinge. Moreover, it includes, but is not limited to, being a smart phone, personal digital assistant (PDA), mobile phone, ultra mobile personal computer (UMPC), etc. The protection cover 40 can be widely applied to any electronic device stated above, so that when using the electronic device, the protection cover effectively prevents the flexible printed circuit board from being damaged.

The electronic device disclosed in the above embodiment of the invention has a protection cover which is coupled to the cap body of the electronic device. When the cap body rotates with respect to the main body of the electronic device, the protection cover isolates the flexible printed circuit board and protects it from the exterior.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
a main body;
a cap body movably disposed on the main body, wherein the cap body is capable of moving between a first position and a second position on the main body, and rotating with respect to the main body in the second position;
a flexible printed circuit board connecting to the main body and the cap body; and
a protection cover slidably disposed on the cap body and having a receiving space, wherein as the cap body rotates in the second position, part of the flexible printed circuit board is within the receiving space and protected by the protection cover.

2. The electronic device according to claim 1, wherein the protection cover comprises a bottom plate and two side plates, the two side plates connect with two edges of the bottom plate to form the receiving space.

3. The electronic device according to claim 2, wherein the bottom plate comprises a shovel-shaped front edge substantially perpendicular to the two edges of the bottom plate for preventing the protection cover from scraping the flexible printed circuit board.

4. The electronic device according to claim 1, wherein the main body comprises a first opening and the cap body comprises a second opening, the protection cover is coupled to the cap body via the second opening, and the flexible printed circuit board gets through the first opening and the second opening to connect with the main body and the cap body.

5. The electronic device according to claim 4, wherein the main body comprises a concave portion adjacent to the first opening for receiving a part of the protection cover and fixing the protection cover on the main body when the cap body moves between the first position and the second position.

6. The electronic device according to claim 4, wherein the main body comprises two opposite first opening side edges and one first opening front edge, wherein the two first opening side edges connect with the first opening front edge to form the first opening, wherein the first opening is substantially rectangular.

7. The electronic device according to claim 6, wherein the concave portion comprises two opposite inner walls adjacent to the two first opening side edges respectively.

8. The electronic device according to claim 6, wherein the main body further comprises two blocks disposed on the two first opening side edges respectively and adjacent to the first opening front edge for fixing the protection cover on the main body.

9. The electronic device according to claim 4, wherein the cap body comprises two opposite second opening side edges, a second opening front edge, and a second opening rear edge, wherein the two second opening side edges connect with the second opening front edge and the second opening rear edge to form the second opening, wherein the second opening is substantially rectangular.

10. The electronic device according to claim 9, wherein the protection cover is coupled to the two second opening side edges and capable of moving between the second opening front edge and the second opening rear edge.

11. The electronic device according to claim 1, further comprising:
   a two-section track structure disposed on an undersurface of the cap body and having a first track and a second track, wherein the first track and the second track form a straight track structure, and the first track is fixed on the cap body;
   a hinge disposed on the cap body and connecting to the second track; and
   a sliding element disposed on the main body and slidably coupled to the two-section track structure;
   wherein as the cap body moves between the first position and the second position, the sliding element slides on the first track and the second track; as the cap body is in the second position, the sliding element is on the second track, and the cap body and the first track are capable of rotating with respect to the main body and the second track via the hinge.

12. The electronic device according to claim 1, further comprising:
   a keyboard disposed on an upper-surface of the main body.

13. The electronic device according to claim 1, further comprising:
   a display device disposed on an upper-surface of the cap body.

14. The electronic device according to claim 1, wherein the electronic device is a portable device.

15. The electronic device according to claim 1, wherein the electronic device is a handheld device.

16. The electronic device according to claim 1, wherein the electronic device is a smart phone, a personal digital assistant (PDA), a mobile phone, or a ultra mobile personal computer (UMPC).

* * * * *